United States Patent

[11] 3,615,939

[72] Inventor William C. Schneider
Williamstown, Mass.
[21] Appl. No. 799,541
[22] Filed Jan. 15, 1969
[23] Continuation of application Ser. No. 550,698, May 17, 1966, abandoned
[45] Patented Oct. 26, 1971
[73] Assignee Sprague Electric Company
North Adams, Mass.

[54] METHOD OF MAKING A LATERAL TRANSISTOR
3 Claims, 4 Drawing Figs.

[52] U.S. Cl. .......... 148/187,
29/571, 29/576, 29/578, 317/235
[51] Int. Cl. .......... H01l 7/00
[50] Field of Search .......... 148/187;
29/576, 578, 571; 317/235 (40)

[56] References Cited

UNITED STATES PATENTS

| | | | |
|---|---|---|---|
| 2,827,599 | 3/1958 | Jochems | 317/235 (40) |
| 3,443,174 | 5/1969 | Busen et al. | 148/187 |
| 3,246,214 | 4/1966 | Hugle | 317/235 (40) |

*Primary Examiner*—L. Dewayne Rutledge
*Assistant Examiner*—R. A. Lester
*Attorneys*—Connolly and Hutz, Vincent H. Sweeney and James P. O'Sullivan

ABSTRACT: The emitter is restricted to the lateral wall of a recess adjacent the collector. Undesirable flow of emitter current into the bulk of the base region is prevented by providing a nonconducting plug in the bottom of the recess. A common emitter DC current gain which is substantially larger than one is obtained by this construction.

METHOD OF MAKING A LATERAL TRANSISTOR

This application is a continuation of application, Ser. No. 550,698, filed May 17, 1966, now abandoned.

This invention relates to an improved lateral transistor in a semiconductive body, and more particularly to parameters which improve the performance of the lateral transistor and to a method of making such a transistor.

PNP planar transistors of the prior art that are formed so as to permit connections from a major surface present a problem of conductivity inversion at the surface when certain easily available materials are used. For example, the use of silicon with a silicon dioxide coat in such a structure presents a problem in surface inversion. Such inversion consists of a change in conductance and possibly in some instances a change in conductivity type within a very thin layer adjacent to the surface of the semiconductive body. Avoidance of this problem in planar silicon PNP transistors requires involved processing steps.

Lateral transistors of the prior art that are formed in a surface of a monolithic semiconductive body as by diffusion to permit connections to the transistor at a major surface of the body are not affected by this inversion problem, and thus provided means for circumventing it. Lateral transistors are designated as the transistor structure having the emitter-base and collector-base junctions formed in the major surface of an opposite conductivity-type body in a flanking arrangement with each other. The important electronic current between these junctions flows laterally from the emitter across an interposed part of the opposite conductivity type and laterally to an elongated section of the collector junction area. The semiconductive body forms the base region of the lateral transistor.

In the fabrication of the lateral-type transistor the emitter and collector junctions are formed by introducing a suitable impurity into the opposite conductivity type body at its major surface. The impurity diffusion forms a smaller emitter region with a larger collector region so that a section of the collector junction area is presented for current flowing laterally to the collector junction. The lateral flow of current is generally in the planar dimension and parallel to the major surface.

The emitter junction has a bulk section through which current flows vertically into the bulk region of the base region. Previous lateral transistors have this undesirable vertical current flowing into the bulk section of the emitter-base junction facing inward toward the bulk of the base region.

Lateral transistors of the PNP silicon variety have previously been limited in the extent to which their principal optimum parameters can be substantially improved. It would be desirable to provide a lateral transistor having improved gain and frequency characteristics.

It is the principal object of this invention to provide a lateral transistor without an undesirable vertical current at the emitter.

It is a further object of this invention to provide a transistor having emitter and collector regions in a monolithic block in which the lateral current is dominant and therefore the device has superior gain and frequency characteristics.

These and other objects of this invention will become more apparent upon consideration of the following description taken together with the accompanying drawing, in which.

In general, this invention provides a lateral transistor in a monolithic body of semiconductive material having a reduced vertical current from the emitter. The vertical current is reduced by the novel geometry of this invention.

Figure 1:
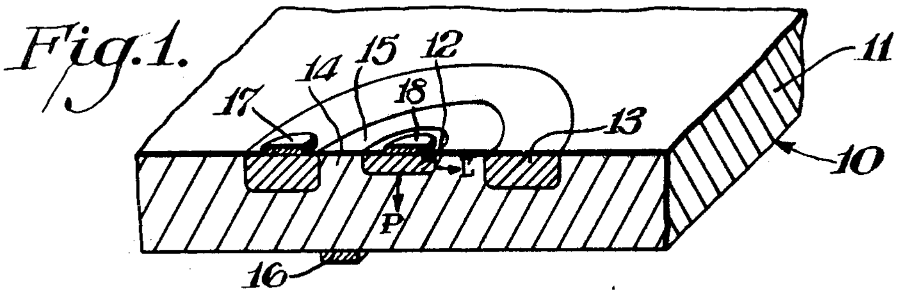
FIG. 1 is a perspective view partly in section of a lateral transistor of the prior art.

The lateral transistor 10 of the prior art is shown in FIG. 1 wherein an N-type silicon body 11 contains a disc-shaped P-type emitter region 12, which is surrounded by a ring-shaped collector region 13. A space provided between collector 13 and emitter 12 acts as a base region 14.

The emitter region 12 is terminated by a junction which is oriented principally in two directions as indicated by L and Pin the sectional showing in FIG. 1. These directions are the lateral and the planar directions, respectively. In the lateral direction the emitter lateral junction area is oriented normal to the major surface, and similar in general to the vertical dimension. In the planar direction the emitter-planar-junction area is oriented parallel to the major surface, and similar in general to the horizontal dimension.

The preparation of such a lateral transistor is simple. A silicon oxide layer 15 is formed on the surface of the silicon body 11 by a thermal growth process, windows for emitter and collector diffusion are etched by a photoresist process, and the emitter and collector regions 12 and 13 are formed by bringing into the silicon body an impurity which can provide within these regions a conductivity-type opposite to that of the bulk of the body 11. This means that if, e.g., the bulk is N-type, the impurity must consist of acceptors which make the emitter and collector regions hole-conducting. Base, collector and emitter contacts 16, 17 and 18, respectively, complete the device.

Without the proper design and preparation as disclosed in this application, the common emitter DC current gain of the lateral PNP transistor is not high. Another limitation is found in the poor high-frequency performance. There have been efforts to circumvent some of the problems by amplifying the collector current of this PNP transistor with an NPN transistor, so that the combined current gain is made comparable to that of the NPN in the same body. Such a combination is undesirable. It is a feature of this invention relating to the lateral structure that an improved lateral transistor is obtained which has performance characteristics comparable to a conventional transistor.

This improvement is achieved by reducing the hole injection in the planar direction as compared with the hole injection in the lateral direction of the emitter-junction area. This is achieved by physically blocking the hole injection related to the vertical current while providing an optimum-emitter lateral-junction area. These features of the structure of this invention result in a gain feature which is substantially different from that of the lateral transistors of the prior art for the same value of the lateral base current.

Figure 2:
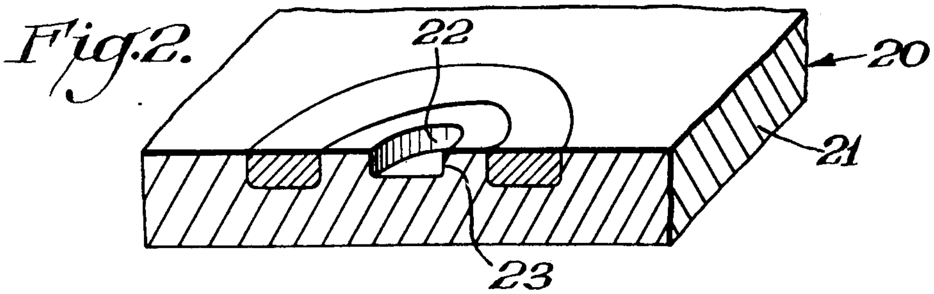
FIGS. 2 and 3 are perspective views partly in section of a monolithic substrate during the fabrication of an embodiment of this invention.
Figure 3:
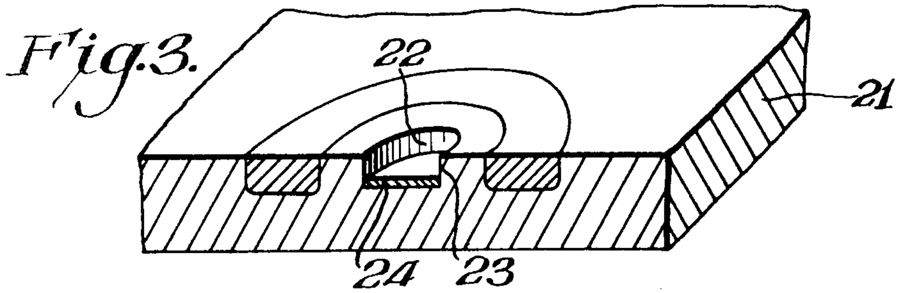
Figure 4:
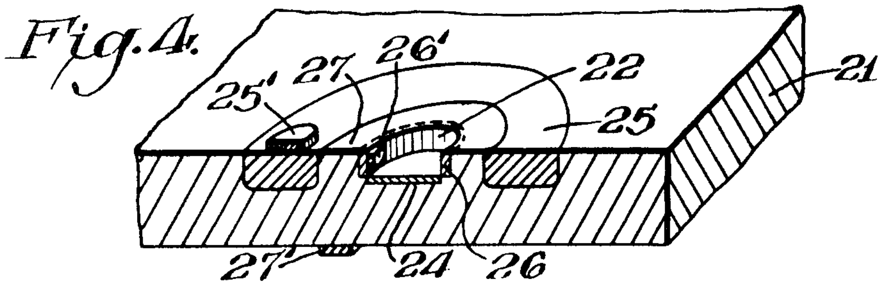
FIG. 4 is a perspective view partly in section of a device of this invention.

Referring to the preferred embodiment shown in FIGS. 2–4, the lateral transistor 20 of this invention has an N-type silicon body 21 at a central location. The channel 22 has a vertical surface 23 normal to the plane of the surface of body 21 and generally in the lateral direction referred to above. A mask 24 is formed in the floor of channel 22 by a suitable technique such as by forming a silicon dioxide layer, FIG. 3.

Next, as illustrated in FIG. 4, by suitable masking and diffusing techniques P-type carriers are diffused into the N-type body 21 to form an elongated collector region 25 and emitter region 26 around the channel 22 by diffusion through the surface to provide an emitter junction, so that the emitter region 26 is centrally located within the collector region 25. The N-type spacing between the collector region 25 and the emitter region 26 is a base region 27. The diffusions are carried on so as to effect a diffusion of acceptor impurities to provide pockets of the P-type material between which current can flow. This collector current flows laterally from the emitter lateral junction area to the collector lateral junction area, which lateral areas are substantially face to face and the current flows as described above. Emitter, base and collector contacts are provided as by suitable metallizations 26', 27' and 25' and electrical connections are attached to these contacts.

This invention provides a lateral transistor in a monolithic body of semiconductive material in which an improved current gain is provided in which the hole injection from the emitter planar junction area is radically reduced. At the same time good hole injection efficiency is provided at the emitter lateral-junction area. These properties of the structure of this invention combine to result in a gain factor which is substantially different from that of the lateral transistors of the prior art by making the emitter current into the bulk region of the emitter planarnjunction area insignificant. Therefore, the gain of the lateral transistors of this invention are greatly improved over the transistors of the prior art.

The improved lateral transistor exhibits a common-emitter DC current gain which is substantially larger than 1. It is a feature of this invention that this current gain is substantially increased by reducing the effective emitter planar-junction area without decreasing the effective emitter lateral junction area.

Previously the PNP lateral transistor of the prior art could be used only in conjunction with a conventionalNPN transistor. Among other advantages, the PNP lateral transistor of this invention exhibits adequate gain to function individually as a conventional transistor. Broadly the structure of this invention provides a high-performance PNP transistor in silicon, using minimum of masking steps, and the process is compatible with present monolithic processes.

Although the above description refers specifically to a PNP-type transistor, it will be appreciated that it is equally applicable to NPN-type transistors. While the above description contains illustrations of the invention it will be understood that modifications of the embodiment as set forth are possible and it will be understood that the scope is intended to be limited only by the appended claims.

What is claimed is:

1. A method of making an improved lateral PNP transistor comprising the steps of forming a recess in a monocrystalline silicon body, forming a silicon oxide layer on said body, etching an emitter window in a lateral surface of said recess and a collector window on the major surface of the body by a photoresist process, diffusing an acceptor-forming impurity through said windows into said body by heating in an atmosphere containing said impurity to form emitter and collector regions, and applying electrical connections to said emitter and collector regions.

2. The method of claim 1 wherein the step of forming a silicon oxide layer includes forming said layer on the lateral and planar surfaces of said recess.

3. The method of claim 2 wherein the step of etching is restricted to etching substantially the entire lateral surface only of said recess and a ring-shaped collector surrounding said recess.

* * * * *